(12) United States Patent
Hu et al.

(10) Patent No.: US 6,307,904 B1
(45) Date of Patent: Oct. 23, 2001

(54) CLOCK RECOVERY CIRCUIT

(75) Inventors: Shih Sheng Hu, Hsin-Tien; Chien Yu Lai, Nan-Tou, both of (TW)

(73) Assignee: Motorola. Inc., Schaumburg, IL (US)

( * ) Notice: Subject to any disclaimer, the term of this patent is extended or adjusted under 35 U.S.C. 154(b) by 0 days.

(21) Appl. No.: 09/231,009

(22) Filed: Jan. 14, 1999

(30) Foreign Application Priority Data

Mar. 31, 1998 (SG) .................................................. 9800666-1

(51) Int. Cl.$^7$ ................................ H04L 7/02; H04L 7/00
(52) U.S. Cl. .............................................. 375/360; 375/350
(58) Field of Search ..................................... 375/355, 371, 375/373, 360, 359, 361; 327/141

(56) References Cited

U.S. PATENT DOCUMENTS

| 4,355,398 | * | 10/1982 | Cook | 375/360 |
| 4,737,971 | * | 4/1988 | Lanzafame et al. | 375/371 |
| 5,297,869 | * | 3/1994 | Benham | 375/361 |
| 5,696,800 | * | 12/1997 | Berger | 375/360 |

\* cited by examiner

Primary Examiner—Tesfaldet Bocure
(74) Attorney, Agent, or Firm—Patricia S. Goddard

(57) ABSTRACT

An edge detector (10) detects edges of clock pulses in a digital signal and provides edge detect pulses to a state corrector (20). A state sequencer (15) receives a clock signal and steps through a sequence of states in accordance with the clock signal to generate a recovered clock signal which is substantially synchronized with the clock pulses in the digital signal. The state corrector (20) selectively providing reset states to reset the state sequencer in accordance with various parameters to maintain synchronization between the clock pulses in the digital signal and the recovered clock signal. The state corrector (20) also inhibits resetting the state sequencer (15) when edge detect pulse produced from instability in the edge detector (10) are received.

19 Claims, 2 Drawing Sheets

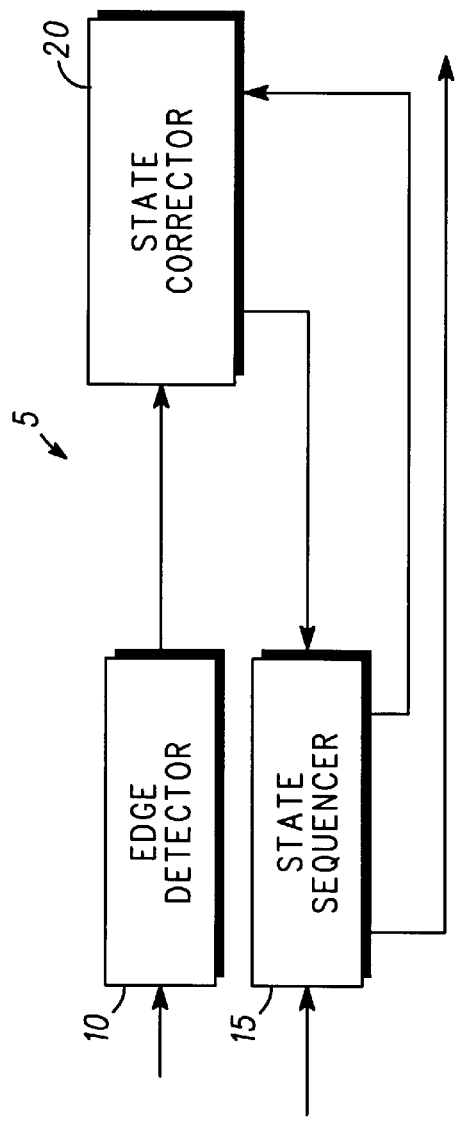
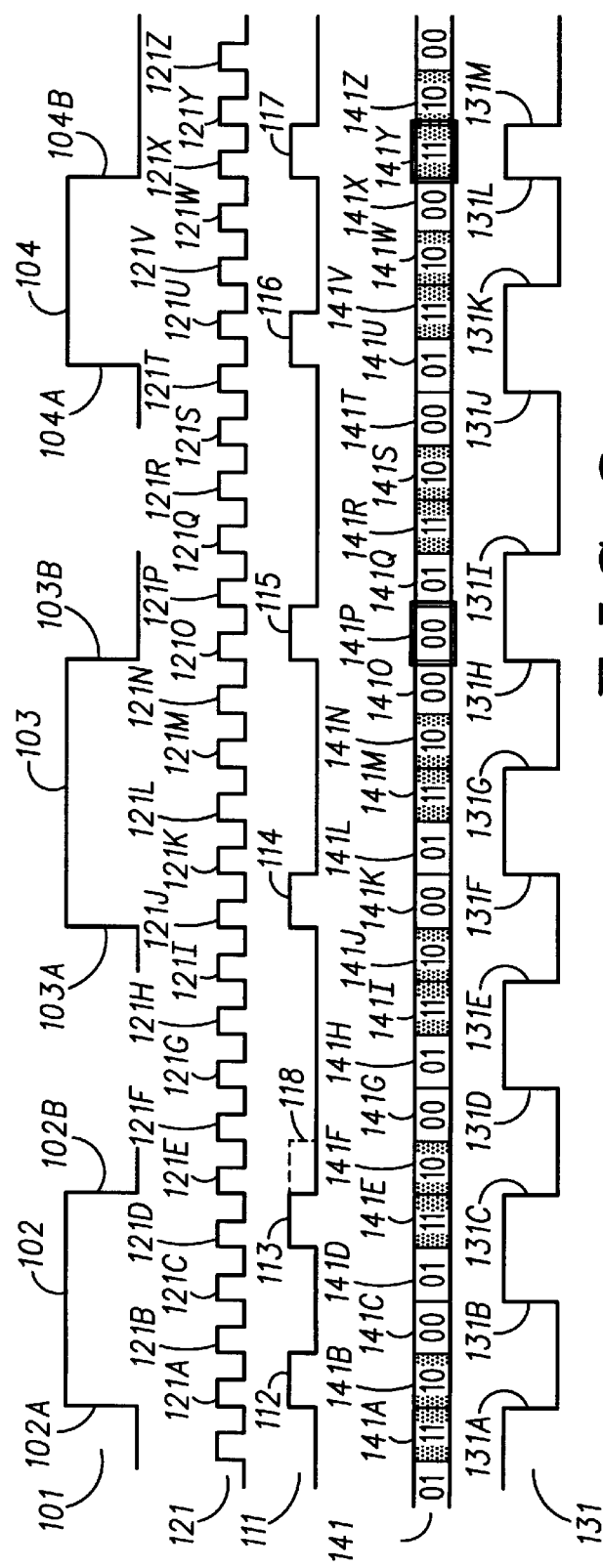

CLOCK RECOVERY CIRCUIT

FIELD OF THE INVENTION

This invention relates to a clock recovery circuit, and more particularly for such a circuit for use in an asynchronous, fixed rate data communication system.

BACKGROUND OF THE INVENTION

In an asynchronous, fixed rate data communication system, data is transmitted at a predetermined fixed clock frequency and is received at a receiver which must have the same predetermined clock in order to recover the transmitted data. The clock at the receiver must thus be synchronised with the clock at the transmitter.

Usually, due to the limited size of the communication channel, or bandwidth, the data information and the transmitter clock information are combined and transmitted together. The receiver must then recover the clock information in order to synchronise with the transmitter.

Conventionally, the receiver includes a clock recovery circuit that uses a receiver clock having a frequency which is higher by an integral multiple N than the transmitter clock, and an edge detector to detect edges of a signal transmitted by the transmitter. A state sequencer having N states is reset by each detected edge and the output of the state sequencer provides a recovered clock signal which must be synchronised with the transmitter clock.

Although such a recovered clock signal is reasonably accurate, a problem occurs when an edge of the receiver clock and an edge of the incoming signal arrive simultaneously at the edge detector. when this occurs, an instability arises and the edge detector can provide its output either correctly or one clock pulse later. If the edge detector output is incorrect, the counter will be incorrectly reset and the recovered clock signal will also be incorrect, causing potential problems with data recovery.

BRIEF SUMMARY OF THE INVENTION

The present invention therefore seeks to provide a clock recovery circuit which overcomes, or at least reduces the above-mentioned problems of the prior art.

Accordingly, in one aspect, the invention provides a clock recovery circuit comprising: a clock information edge detector comprising: a digital signal input; and an edge detect signal output; a state sequencer comprising: a clock signal input; a current state signal output; a state reset signal input; and a recovered clock information signal output; and a state corrector comprising: an edge detect signal input coupled to the edge detect signal output of the clock information edge detector; a current state signal input coupled to the current state signal output of the state sequencer; and a state reset signal output coupled to the state reset signal input of the state sequencer.

In another aspect the present invention provides a method for recovering a clock signal comprising the steps of: receiving a clock signal and a digital signal which includes clock information edges, wherein the clock signal has an integral multiple N higher frequency than that of the digital signal; stepping through a predetermined sequence of N states in accordance with the clock signal; providing a current state signal indicating a current state; detecting a clock information edge in the digital signal; counting the number of states since the detection of the last clock information edge; determining whether the current state is one of a plurality of predetermined allowable states; comparing the number of states counted with N; resetting a state sequencer to an earlier state than the current state when the number of states counted is greater than N; resetting the state sequencer to a later state than the current state when the number of states counted is less than N; and generating a recovered clock information signal in accordance with at least part of the current state signal.

BRIEF DESCRIPTION OF THE DRAWINGS

One embodiment of the invention will now be more fully described, by way of example, with reference to the drawings, of which:

FIG. 1 shows a block diagram of a clock recovery circuit in accordance with the present invention;

FIG. 2 shows timing waveforms of the clock recovery circuit of FIG. 1; and

DETAILED DESCRIPTION OF THE DRAWINGS

Figure 3:
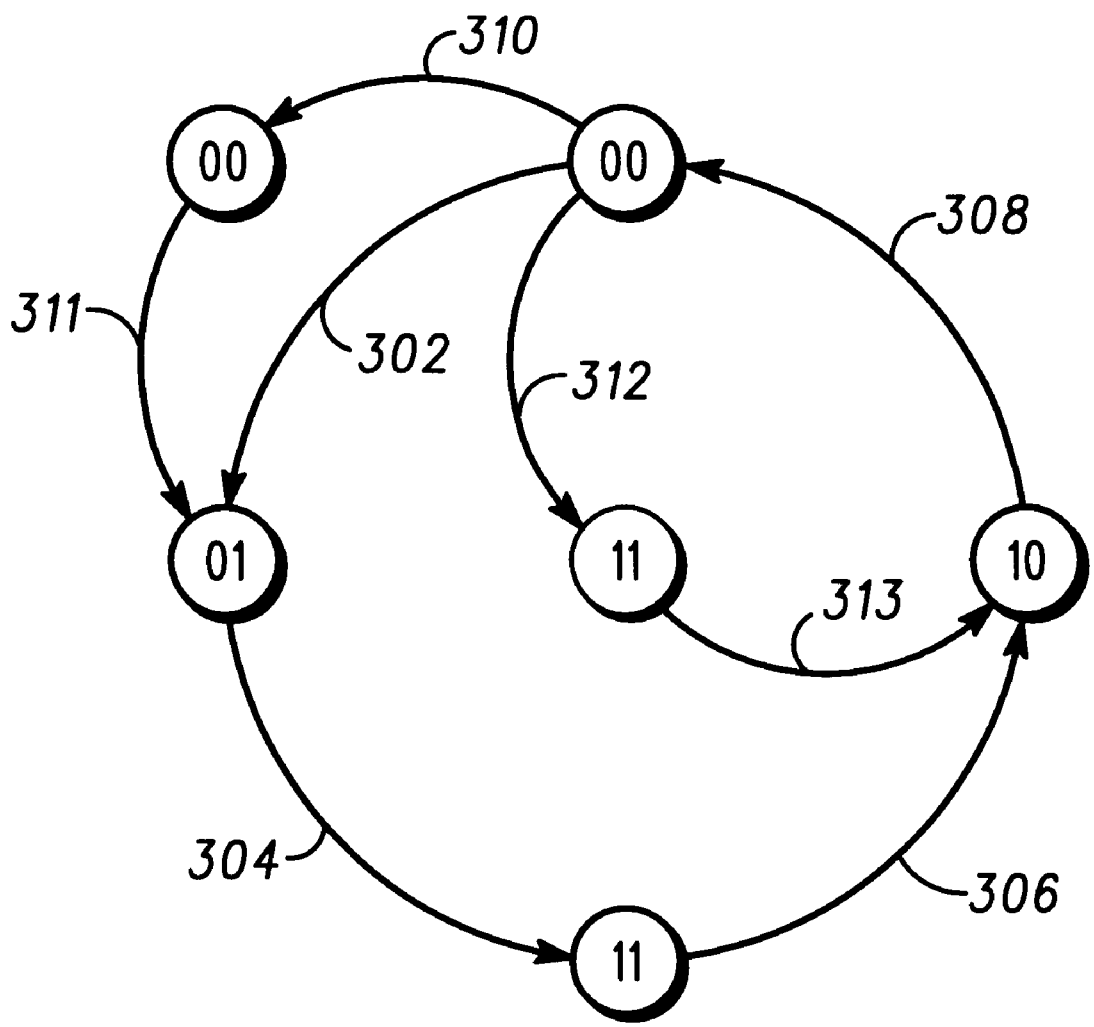
FIG. 3 shows a state diagram of the clock recovery circuit of FIG. 1.

With reference to FIGS. 1 and 2 a clock recovery circuit 5 includes an edge detector 10, a 2 binary-digit (bit) Grey code state sequencer 15, and a state corrector 20. The edge detector 10 has an input coupled to receive a digital signal 101, which includes clock information pulses 102–104, from a transmitter (not shown), and an output that provides an edge detect signal 111 which has edge detect pulses 112–117. Each of the edge detect pulses 112–117 is produced when a rising edge 102A–104A or a falling edge 102B–104B of the clock information pulses 102–104 is detected in the digital input signal 101.

The 2-bit Grey code state sequencer 15 has an input which is coupled to receive a clock signal 121, and an output which is coupled to provide a recovered clock signal 131. The frequency of the clock signal 121 is four times the frequency of the clock information pulses 102–104 in the digital signal 101, and the recovered clock signal 131 indicates the timing of the clock information pulses 102–104 in the digital signal 101. The 2-bit Grey code state sequencer 15 has four states represented by the sequence 00,01,10,11, and it sequentially steps through these four states when a clock pulse of the clock signal 121 is received. The state of the 2-bit Grey code state sequencer 15 is indicated by a reference designator 141.

Another input of the 2-bit Grey code state sequencer 15 is coupled to receive a reset signal indicating a reset state which is one of the four states, and another output of the 2-bit Grey code state sequencer 15 is coupled to provide a current state signal indicating the current state.

Now with additional reference to FIG. 3, the arrows between the four states 00,01,11 and 10 indicate the sequence of transitions 302, 304, 306 and 308 that the 2-bit Grey code state sequencer 15 sequentially steps through. Reset transitions 310 and 312 to reset states 00 and 11, occur when the current state of the 2-bit Grey code state sequencer 15 is 00. When the current state of the 2-bit Grey code state sequencer 15 is 00 and the reset signal indicates the reset state 00, then when the next clock pulse of the clock signal 121 occurs, the 2-bit Grey code state sequencer 15 transitions 310 from the 00 state to the reset state 00. Alternatively, when the current state of the 2-bit Grey code state sequencer 15 is the 00 state and the reset signal indicates the reset state 11, then when the next clock pulse of the clock signal 121 occurs, the 2-bit Grey code state sequencer 15 transitions 312 from the 00 state to the reset state 11.

A Grey code sequence is used to reduce the need for additional decoding circuitry to provide the recovered clock signal 131. This is accomplished by using the second bit of the two bits representing the four states to provide the recovered clock signal 131. In addition, the Grey code sequence is less prone to race conditions.

The number of states of the state sequence of the 2-bit Grey code sequencer 15 is selected to match the multiple by which the frequency of the clock signal 35 is greater than the frequency of the clock pulses 102–104 in the digital input signal 101. Hence, if the frequency of the clock signal 121 is eight times the frequency of the clock information pulses 102–104, a 3-bit Grey code sequencer is required.

The state corrector 20 has an input coupled to receive the edge detect signal 111 from the edge detector 10, an output that provides the reset signal to the 2-bit Grey code state sequencer 15 and another input that receives the current state signal from the 2-bit Grey code state sequencer 15. The state corrector 20 has a memory that stores two states 11 and 10. These two states are non-resetable states 141 (shown shaded). When the current state of the 2-bit Grey code state sequencer 15 indicated by the current state signal is either of these two states, the state corrector 20 is inhibited from resetting the 2-bit Grey code state sequencer 15.

Instability in the edge detector 10 can cause the edge detect pulse 112–117 to be produced when one of edges 102A–104A and 102B–104B occurs or earlier by one clock pulse of the clock signal 121.

Hence, by selecting the non-resetable states to ones that occur on or just before the time the edge detect pulses 112–117 occurs, the present invention advantageously reduces erroneously resetting the 2-bit Grey code state sequencer 15. Inhibiting erroneous resetting allows the 2-bit Grey code state sequencer 15 to continue stepping through the sequential states. This allows the recovered clock signal 131 to remain in synchronisation with the clock information pulses 102–104 in the digital signal 101, substantially unaffected by the instability in the edge detector 10.

The state corrector 20 also includes a counter (not shown) that counts the number of states between the occurrence of subsequent edge detect pulses, e.g. between 112 and 113, 114 and 115 and between 116 and 117. When the current state of the 2-bit Grey code state sequencer 15 is not one of the non-resetable states 11 and 10; and one of the edge detect pulses 112–117 is received; and the counter value is greater than four; and the current state is the 00 state, then the state corrector 20 produces the reset signal indicating the reset state 00. This causes the 2-bit Grey code state sequencer 15 to transition 310 to the reset state 00 on the occurrence of the next clock pulse of the clock signal 121. When the current state of the 2-bit Grey code state sequencer 15 is not one of the non-resetable states 11 and 10; and one of the edge detect pulses 112–117 is received; and the counter value is less than four; and the current state is the 00 state, then the state corrector 20 produces the reset signal indicating the reset state 11. This causes the 2-bit Grey code state sequencer 15 to transition 312 to the 11 state on the occurrence of the next clock pulse of the clock signal 121.

In operation, when the rising edge 102A in the data input signal 101 occurs during the clock pulse 121A of the clock signal 121, the edge detector 10 detects the rising edge 102A and produces the edge detect pulse 112 having a predetermined duration. The state corrector 20 determines that the current state 11(141A) is a non-resetable state, and consequently, the 2-bit Grey code state sequencer 15 is not reset by the state corrector 20. Instead, with the occurrence of the clock pulse 121A, the 2-bit Grey code state sequencer 15 transitions from the current state 11(141A) to the next state 10(141B) in the sequence of states. As the recovered output signal 131 is determined by the second bit of the sequential states, and the second bit changes from 1 to 0, the falling edge 131A is produced.

When the clock pulses 121B and 121C occur the 2-bit Grey code state sequencer 15 transitions from the state 10(141B) to the state 00(141C), and then from the state 01(141C) to the state 11(141D), because an edge detect pulse is not detected. As the second bit changes from 0 to 1 on the occurrence of the clock pulse 121C, the rising edge 131B is produced in the recovered clock signal 131.

A falling edge 102B occurs during the clock pulse 121D and because of instability of the edge detector 10, the edge detect pulse 113 is received by the state corrector 20. The instability causes the edge detect pulse 113 to occur earlier i.e. during the clock pulse 121D instead of occurring as a later edge detect pulse 118 during the clock pulse 121E. However, the state corrector 20 determines that the counter value is four and that the current state 11(141E) is one of the non-resetable states, and consequently, the state corrector 20 does not provided either of the reset states to the 2-bit Grey code state sequencer 15. This allows the 2-bit Grey code state sequencer 15 to transition from the state 11(141E) to the next state 10 (141F) in the state sequence, unaffected by the early occurrence of the edge detect pulse 113. Consequently, the falling edge 131C in the recovered clock signal 131 is produced to coincide with the falling edge 102B, thus, ensuring the clock information pulse 102 is properly recovered.

As explained above, instability in the edge detector 15 can cause the edge detector pulse 118 to occur at an earlier time than it should. Such edge detect pulses 118 can erroneously set the 2-bit Grey code state sequencer 15 to another state instead of continuing to the next state in the sequence of states. The state corrector 20 advantageously inhibits the edge detector 10 from resetting the 2-bit Grey code state sequencer 15, except when the clock pulses 102–104 in the digital signal 101 are not synchronised with the generation of the recovered clock signal 131.

The description that follows details corrective action in the clock recovery circuit 5 to maintain synchronisation between the clock pulses 102–104 in the digital signal 101 and the recovered clock signal 131 when the clock pulses 102–104 in the digital signal 101 are not synchronised with the generation of the recovered clock signal 131.

There are two conditions when the corrective action is required. A first condition occurs when the time between subsequent edge detect pulses 112–117 is longer than expected, i.e. greater than four clock pulses of the clock signal 121. This occurs when the timing of the recovered clock signal is ahead of that of the clock pulses 102–104 in the digital signal 101. A second condition occurs when the time between subsequent edge detect pulses 112–117 is less than expected i.e. less than four clock pulses of the clock signal 121. This occurs when the timing of the recovered clock signal is behind that of the clock pulses 102–104 in the digital signal 101.

With further reference to FIGS. 1–3, the rising edge 103A occurs during the clock pulse 121J, and the edge detector 10 produces the edge detect pulse 114. The counter in the state corrector 20 starts counting from 1 for the clock pulse 121J, and the 2-bit Grey code sequencer 15 transitions from the state 10(141J) to the state 00(141K), which causes the recovered signal 131 to remain at the logic low or "0" level.

As clock pulses 121K,L,M and N occur the 2-bit Grey code sequencer 15 transitions through the sequence of states i.e. the state 01(141L), the state 11(141M), the state 10(141N), and the state 00(141O).

When the falling edge 103B occurs during the clock pulse 121O, the edge detect pulse 115 is produced by the edge detector 10. In response to receiving the edge detect pulse 115, the state corrector 20 determines the counter value and whether the current state of the 2-bit Grey code sequencer 15 is a non-resetable state. The state corrector 20 determines that the counter value is 5 as 5 clock pulse 121J,K,L,M and N have occurred since the last edge detect pulse 114 occurred, and there have been 5 state transitions from the state 141K–141O. In addition, the current state 141O is 00 which means the 2-bit Grey code sequencer 15 can be reset. The state corrector 20 then compares the counter value 5 with the number four, and as the counter value is greater than four, the state corrector 20 produces the reset signal indicating the reset state 00.

The 2-bit Grey code sequencer 15 receives the reset state 00 and on the occurrence of the clock pulse 121O, the 2-bit Grey code sequencer 15 transitions 310 from the state 00(141O) to the reset state 00(141P). And on the occurrence of the next clock pulse 121P, the 2-bit Grey code sequencer 15 transitions 311 to the state 01(141Q). As can be seen in FIG. 3 the transition 310 from the state 00 to the reset state 00 shifts the state sequence of the 2-bit Grey code sequencer 15, slowing it down. As the recovered clock signal 131 was ahead of the clock pulses 102–104 in the digital signal 101, the slowing down of the state sequence of the 2-bit Grey code sequencer 15 improves the synchronisation between the recovered clock signal 131 and the clock pulses 102–104 in the digital signal 101.

Again with reference to FIGS. 1–3, the rising edge 104A occurs during the clock pulse 121T, and the edge detector 10 produces the edge detect pulse 116. The counter in the state corrector 20 starts counting from 1 for the clock pulse 121T, and the 2-bit Grey code sequencer 15 is in the state 01(141U). As clock pulses 121U and V occur, the 2-bit Grey code sequencer 15 transitions through the state 11(141V) and the state 10(141W).

When the falling edge 104B occurs during the clock pulse 121X, the edge detect pulse 117 is produced by the edge detector 10. In response to receiving the edge detect pulse 117, the state corrector 20 determines the counter value and whether the current state of the 2-bit Grey code sequencer 15 is a non-resetable state. The state corrector 20 determines that the counter value is 3 as clock pulses 121U,V and W have occurred since the last edge detect pulse 116 occurred, and there have been 3 state transitions from the state 141V to 141X. In addition, the current state 141X is 00 which means the 2-bit Grey code sequencer 15 can be reset. The state corrector 20 then compares the counter value 3 with the number four, and as the counter value is less than four, the state corrector 20 produces the reset signal indicating the reset state 11.

The 2-bit Grey code sequencer 15 receives the reset state 11 and on the occurrence of the clock pulse 121X, the 2-bit Grey code sequencer 15 transitions 312 from the state 00(141X) to the state 11(141Y). And on the occurrence of the next clock pulse 121Y, the 2-bit Grey code sequencer 15 transitions 313 to the state 10(141Z). As can be seen in FIG. 3 the transition 312 from the state 00 to the reset state 11 shifts the state sequence of the 2-bit Grey code sequencer 15, speeding it up. As the recovered clock signal 131 was behind the clock pulses 102–104 in the digital signal 101, the speeding up of the state sequence of the 2-bit Grey code sequencer 15 improves the synchronisation between the recovered clock signal 131 and the clock pulses 102–104 in the digital signal 101.

Hence, the present invention advantageously improves the recovery of the clock pulses 102–104 in the digital signal 101. This is accomplished by inhibiting resetting of the 2-bit Grey code sequencer 15 during selected states to prevent erroneous resetting by edge detect pulses 112–117 caused by instability in the edge detector 10. In addition, the 2-bit Grey code sequencer 15 is reset to selected states dependent on various parameters to improve the synchronisation between the clock pulses 102–104 in the digital signal 101 and the recovered clock signal.

Hence, the present invention therefore provides a clock recovery circuit which overcomes, or at least reduces, the above-mentioned problems of the prior art.

It will be appreciated that although only one particular embodiment of the invention has been described in detail, various modifications and improvements can be made by a person skilled in the art without departing from the scope of the present invention.

What is claimed is:

1. A clock recovery circuit comprising:
    a clock information edge detector comprising:
        a digital signal input; and
        an edge detect signal output;
    a state sequencer comprising:
        a clock signal input;
        a current state signal output;
        a state reset signal input; and
        a recovered clock information signal output; and
    a state corrector comprising:
        an edge detect signal input coupled to the edge detect signal output of the clock information edge detector;
        a current state signal input coupled to the current state signal output of the state sequencer; and
        a state reset signal output coupled to the state reset signal input of the state sequencer.

2. A clock recovery circuit in accordance with claim 1 wherein:
    the clock information edge detector comprises a clock information edge detector means for receiving a digital signal which includes clock information and for providing a detect signal indicative of detection of clock information edges in the digital signal;
    the state sequencer comprises a state sequencer means for receiving a clock signal having a frequency that is greater than that of the digital input signal by a factor N, for stepping through a predetermined sequence of N states in accordance with the clock signal, for providing a current state signal indicating a current state, for receiving a state reset signal indicating a reset state, and for providing a recovered clock information signal in accordance with at least part of the current state signal; and
    the state corrector comprises a state corrector means for receiving the detect signal and the current state signal, for determining whether the current state is one of a plurality of predetermined resettable states, for providing the state reset signal, wherein the state corrector means includes a state counter means for counting the number of states between subsequent clock information edges,
        and when at least one clock information edge is detected and the current state is one of the plurality of predetermined resettable states, the state corrector means being adapted to provide the state reset signal indicating:
an earlier state than the current state when the state counter means value is greater than N; and
a later state than the current state when the state counter means value is less than N.

3. A clock recovery circuit comprising:
an edge detector means having an input for receiving a digital signal which includes clock information edges and an output for providing a detect signal indicative of detection of the clock information edges in the digital signal;
a state sequencer means having a first input for receiving a clock signal having a frequency that is greater than that of the digital signal by a factor N, for stepping through a predetermined sequence of N states in accordance with the clock signal, the state sequencer means having a first output for providing a current state signal indicating a current state, a second input for receiving a state reset signal indicating a reset state, and a second output for providing a recovered clock information signal in accordance with at least part of the current state signal; and
a state corrector means having a first input coupled to the output of the edge detector means for receiving the edge detect signal, a second input coupled to the first output of the state sequencer means to receive the current state signal, the state corrector means for determining whether the current state is one of a plurality of predetermined resettable states, and a second output coupled to the second input of the state sequencer means to provide the state reset signal, wherein the state corrector means includes a state counter means for counting the number of states between subsequent clock information edges,
and when at least one clock information edge is detected and the current state is one of the plurality of predetermined resettable states, the state corrector means being adapted to provide the state reset signal indicating:
an earlier state than the current state when the state counter means value is greater than N; and
a later state than the current state when the state counter means value is less than N.

4. A clock recovery circuit according to claim 3, wherein state corrector means is adapted to provide the state reset signal indicating the current state when the state counter means value is greater than N.

5. A clock recovery circuit according to claim 3, wherein the current state is at least one of the N states.

6. A clock recovery circuit according to claim 3, wherein the reset state is at least one of the N states.

7. A clock recovery circuit according to claim 3, wherein the earlier state is at least one of the N states.

8. A clock recovery circuit according to claim 3, wherein the later state is at least one of the N states.

9. A clock recovery circuit according to claim 3, wherein the plurality of predetermined resettable states comprises selected states of the N states.

10. A clock recovery circuit according to claim 3, wherein the plurality of predetermined resettable states comprises selected combinations of states of the N states.

11. A clock recovery circuit according to claim 3, wherein the number N is 4 and the state sequencer means has 4 states.

12. A clock recovery circuit according to claim 3, wherein the state sequencer means comprises a Grey code state sequencer.

13. A clock recovery circuit according to claim 3, wherein the corrector means comprises a memory means for storing the plurality of predetermined resettable states.

14. A method for recovering a clock signal comprising the steps of:
a) receiving a clock signal and a digital signal which includes clock information edges, wherein the clock signal has an integral multiple N higher frequency than that of the digital signal;
b) stepping through a predetermined sequence of N states in accordance with the clock signal;
c) providing a current state signal indicating a current state;
d) detecting a clock information edge in the digital signal;
e) counting the number of states since the detection of the last clock information edge;
f) determining whether the current state is one of a plurality of predetermined allowable states;
g) comparing the number of states counted with N;
h) resetting a state sequencer to an earlier state than the current state when the number of states counted is greater than N;
i) resetting the state sequencer to a later state than the current state when the number of states counted is less than N; and
j) generating a recovered clock information signal in accordance with at least part of the current state signal.

15. A method according to claim 14, wherein step (h) comprises the step of resetting the state sequencer to the current state when the number of states counted is greater than N.

16. A method according to claim 14, wherein stepping through the reset state comprises the step of stepping through at least one of the N states.

17. A method according to claim 14, wherein stepping through the earlier state comprises the step of stepping through at least one of the N states.

18. A method according to claim 14, wherein stepping through the later state comprises the step of stepping through at least one of the N states.

19. A method according to claim 14 wherein step (c) comprises the step of stepping from the current state to the next sequential state of the N states when the at least one of the clock information edges is detected by the edge detector.

* * * * *